(12) United States Patent
Widmann

(10) Patent No.: US 7,561,282 B1
(45) Date of Patent: Jul. 14, 2009

(54) TECHNIQUES FOR DETERMINING OVERLAY AND CRITICAL DIMENSION USING A SINGLE METROLOGY TOOL

(75) Inventor: Amir Widmann, Sunnyvale, CA (US)

(73) Assignee: KLA-Tencor Technologies Corporation, Milpitas, CA (US)

(*) Notice: Subject to any disclaimer, the term of this patent is extended or adjusted under 35 U.S.C. 154(b) by 451 days.

(21) Appl. No.: 11/552,918

(22) Filed: Oct. 25, 2006

Related U.S. Application Data

(60) Provisional application No. 60/786,560, filed on Mar. 27, 2006.

(51) Int. Cl.
*G01B 11/00* (2006.01)
*G01B 11/24* (2006.01)

(52) U.S. Cl. ............... 356/601; 356/625; 356/401; 356/620

(58) Field of Classification Search ........... 356/401, 356/601, 620, 625
See application file for complete search history.

(56) References Cited

U.S. PATENT DOCUMENTS

| | | | |
|---|---|---|---|
| 6,590,656 | B2 | 7/2003 | Xu et al. |
| 6,650,424 | B2 | 11/2003 | Brill et al. |
| 6,982,793 | B1 | 1/2006 | Yang et al. |
| 7,080,330 | B1 | 7/2006 | Choo et al. |
| 7,193,715 | B2 * | 3/2007 | Smedt et al. ............ 356/401 |
| 7,283,226 | B2 | 10/2007 | Hasan |
| 7,289,213 | B2 | 10/2007 | Mieher et al. |
| 7,317,531 | B2 | 1/2008 | Mieher et al. |
| 7,477,405 | B2 * | 1/2009 | Finarov et al. ............ 356/625 |
| 2003/0002043 | A1 | 1/2003 | Abdulhalim et al. |
| 2005/0157297 | A1 | 7/2005 | Abdulhalim et al. |
| 2008/0049226 | A1 | 2/2008 | Mieher et al. |

OTHER PUBLICATIONS

US Office Action dated Sep. 25, 2006 issued in U.S. Appl. No. 10/785,732 (7,289,213).
US Office Action date Mar. 9, 2007 issued in U.S. Appl. No. 10/785,732 (7,289,213).
Notice of Allowance and Allowed Claims dated Jun. 26, 2007 issued in U.S. Appl. No. 10/785,732 (7,289,213).
US Office Action dated Jun. 11, 2008 issued in U.S. Appl. No. 11/926,603.

* cited by examiner

*Primary Examiner*—L. G Lauchman
*Assistant Examiner*—Gregory J. Toatley, Jr.
(74) *Attorney, Agent, or Firm*—Weaver Austin Villeneuve & Sampson LLP

(57) ABSTRACT

Disclosed are semiconductor targets for measuring with a metrology tool having at least two incident beam modules and techniques for measuring the same. In one embodiment, the target includes an overlay target and a critical dimension (CD) target in the form of periodic features, and the overlay and CD targets are spaced apart by a distance that substantially matches a bore distance between two of the incident beam modules of the metrology tool. In another embodiment, the target includes two overlay targets in the form of periodic features and that are spaced apart by a distance that substantially matches a bore distance between two of the incident beam modules of the metrology tool. In another embodiment, the target includes two CD targets in the form of periodic features and that are spaced apart by a distance that substantially matches a bore distance between two of the incident beam modules of the metrology tool.

20 Claims, 12 Drawing Sheets

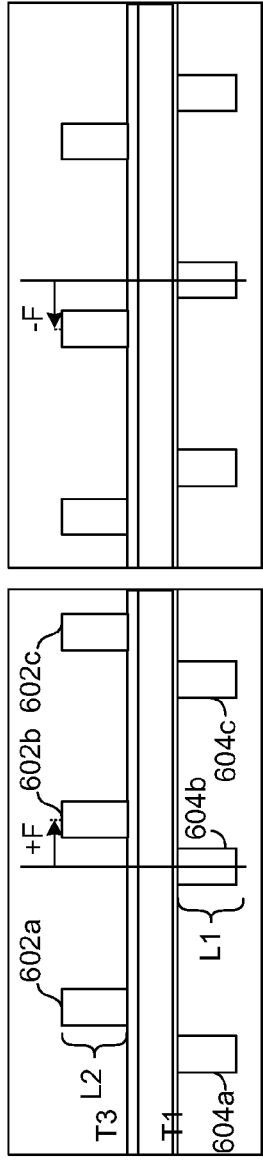
Fig. 6(a)
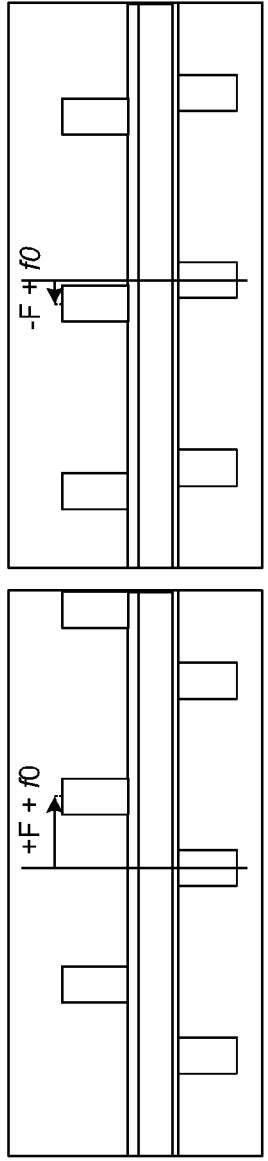
Fig. 6(b)
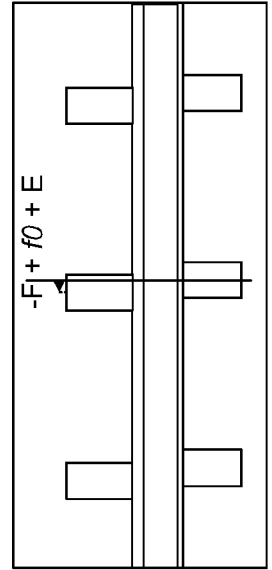
Fig. 6(c) / Fig. 6(d)
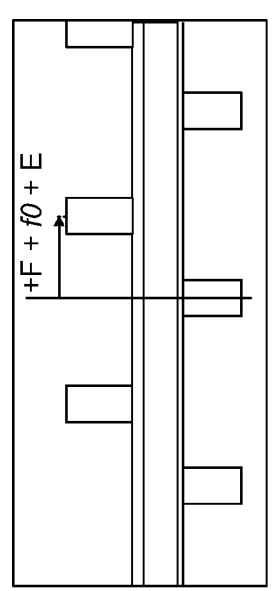
Fig. 6(e) / Fig. 6(f)

TECHNIQUES FOR DETERMINING OVERLAY AND CRITICAL DIMENSION USING A SINGLE METROLOGY TOOL

RELATED APPLICATION DATA

The present application claims priority under 35 U.S.C. 119(e) to U.S. Provisional Patent Application No. 60/786,560, filed Mar. 27, 2006, the entire disclosure of which is incorporated herein by reference for all purposes.

BACKGROUND OF THE INVENTION

The present invention relates to determination of overlay between structures formed in single or multiple semiconductor layers and to determination of critical dimension (CD) of semiconductor features. More particularly, it relates to metrology tools that are used to measure or determine overlay and CD.

In various manufacturing and production environments, there is a need to control alignment between various layers of samples, or within particular layers of such samples. For example, in the semiconductor manufacturing industry, electronic devices may be produced by fabricating a series of layers on a substrate, some or all of the layers including various structures. The relative position of such structures both within particular layers and with respect to structures in other layers is relevant or even critical to the performance of completed electronic devices.

The relative position of structures within such a sample is sometimes called overlay. Various technology and processes for measuring overlay have been developed and employed with varying degrees of success. More recently, various efforts have been focused on utilizing radiation scatterometry as a basis for overlay metrology. Scatterometry has also been utilized to measure critical dimensions (CDs) of a CD target.

Conventional techniques for obtaining overlay and CD include two measurement sessions: one for the CD and one for the overlay. That is, two separate measurements are required on two separate metrology tools. The wafer is typically first loaded into an overlay metrology tool to determine overlay on the wafer's overlay targets. The wafer is then unloaded from the overlay tool and loaded into a CD metrology tool to then measure CD on the wafer's CD targets. Needless to say, this bifurcated measurement process requires significant overhead and time.

Therefore, it would be beneficial to reduce the overhead for obtaining overlay and CD on a wafer or the like.

SUMMARY OF THE INVENTION

Accordingly, semiconductor targets for measuring with a metrology tool having at least two incident beam modules and techniques for measuring the same are provided. In one embodiment, the target includes an overlay target and a critical dimension (CD) target in the form of periodic features, and the overlay and CD targets are spaced apart by a distance that substantially matches a bore distance between two of the incident beam modules of the metrology tool. In another embodiment, the target includes two overlay targets in the form of periodic features and that are spaced apart by a distance that substantially matches a bore distance between two of the incident beam modules of the metrology tool. In another embodiment, the target includes two CD targets in the form of periodic features and that are spaced apart by a distance that substantially matches a bore distance between two of the incident beam modules of the metrology tool.

In one embodiment, a method of determining a characteristic of a plurality of periodic structures using a scatterometry metrology tool having two or more measurement modules for generating two or more optical beams is disclosed. A first periodic target that is formed from a plurality of features is provided. A second periodic target that is formed from a plurality of features is provided. The first and second periodic targets are each in the form of a periodic critical dimension (CD) target or a periodic overlay target. The first and second periodic targets are disposed on a same substrate and a center of the first periodic target has a distance from a center of the second periodic target and such distance substantially matches a bore distance between a first and a second measurement module of the scatterometry metrology tool. A first spectra is obtained from the first periodic target using the first measurement module while substantially simultaneously obtaining a second spectra from the second periodic target. The first spectra is analyzed to determine a first characteristic of the first periodic target and the second spectra is analyzed to determine a second characteristic of the second periodic target. The first and second characteristics are each an overlay value, a CD value, or a profile value.

In a specific implementation, the first periodic target is a periodic CD target and the second periodic target is a periodic overlay target, and the first characteristic is an CD or profile value and the second characteristic is an overlay value. In a further aspect, the second spectra includes spectra from the first overlay target and a second overlay target, the method further comprising obtaining spectra from a third and fourth overlay target, wherein the overlay value is determined based on the spectra from the first, second, third, and fourth overlay targets. In one feature, a spectra is obtained from the third and fourth overlay targets while a third spectra is obtained from a second CD target. In another feature, a spectra is obtained from the third and fourth overlay targets while a third spectra is obtained from a second CD target.

In yet a further aspect, the spectra from the first and second overlay targets are obtained when the first spectra is obtained from the CD target. In another aspect, second spectra is analyzed in conjunction with spectra obtained from at least two other overlay targets on a same layer as the first overlay target and spectra obtained from at least three other overlay targets on a second layer to determine an overlay value. In a further embodiment, the overlay value is determined without using a reference spectra obtained from overlay targets measured on a reference sample or simulation of overlay measurements.

In another aspect, the first and second periodic targets are each a periodic CD target and the first and second characteristics are CD/profile characteristics. In yet another aspect, the first and second periodic targets are each a periodic overlay target and the first and second characteristics are overlay values.

In an alternative embodiment, the first measurement module is a spectroscopic ellipsometer and the second measurement module is a spectroscopic reflectometer. In another aspect, the first and second measurement modules are each spectroscopic ellipsometers. In yet another feature, the first and second measurement modules are each and the second measurement module are each spectroscopic reflectometers. In another embodiment, one of the measurement modules is a multi-spot system may be used to achieve two spots that illuminate the same grating in an Azimuth angle of 90 degrees.

In another aspect, the invention pertains to a method of forming a semiconductor target for measurement with a scatterometry metrology tool having two or more measurement modules for generating two or more optical beams. A first periodic target that has a plurality of features is formed, and a second periodic target that has a plurality of features is formed. The first and second periodic targets can be a periodic critical dimension (CD) target or a periodic overlay target. The first and second periodic targets are disposed on a same substrate and formed such that a center of the first periodic target has a distance from a center of the second periodic target and such distance substantially matches a bore distance between a first and a second measurement module of the scatterometry metrology tool. In a further aspect, a first spectra is obtained from the first periodic target using the first measurement module while substantially simultaneously obtaining a second spectra from the second periodic target. The first spectra is analyzed to determine a first characteristic of the first periodic target and the second spectra is analyzed to determine a second characteristic of the second periodic target. The first and second characteristics can each be an overlay value, a CD value, or a profile value.

In another embodiment, a semiconductor target for measurement with a scatterometry metrology tool having two or more measurement modules for generating two or more optical beams is disclosed. The target includes a first periodic target that has a plurality of features and is selected from a group consisting of a periodic critical dimension (CD) target and a periodic overlay target and a second periodic target that has a plurality of features and is selected from a group consisting of a periodic critical dimension (CD) target and a periodic overlay target. The first and second periodic targets are disposed on a same substrate and have a center of the first periodic target has a distance from a center of the second periodic target and such distance substantially matches a bore distance between a first and a second measurement module of the scatterometry metrology tool. In another aspect, the first periodic target is a periodic CD target and the second periodic target is a periodic overlay target. In another aspect, the first and second periodic targets are each a periodic CD target and the first and second characteristics are CD/profile characteristics. In yet a final aspect, the first and second periodic targets are each a periodic overlay target and the first and second characteristics are overlay values.

These and other features and advantages of the present invention will be presented in more detail in the following specification of the invention and the accompanying figures which illustrate by way of example the principles of the invention.

BRIEF DESCRIPTION OF THE DRAWINGS

FIG. 6(a) is a side view illustration of a patterned top layer L2 being offset by an amount +F from a patterned bottom layer L1 in accordance with one embodiment of the present invention.

FIG. 6(b) is a side view illustration of a patterned top layer L2 being offset by an amount −F from a patterned bottom layer L1 in accordance with one embodiment of the present invention.

FIG. 6(c) is a side view illustration of a patterned top layer L2 being offset by an amount +F+f0 from a patterned bottom layer L1 in accordance with one embodiment of the present invention.

FIG. 6(d) is a side view illustration of a patterned top layer L2 being offset by an amount −F+f0 from a patterned bottom layer L1 in accordance with one embodiment of the present invention.

FIG. 6(e) is a side view illustration of a patterned top layer L2 being offset by an amount +F+f0+E from a patterned bottom layer L1 in accordance with one embodiment of the present invention.

FIG. 6(f) is a side view illustration of a patterned top layer L2 being offset by an amount −F+f0+E from a patterned bottom layer L1 in accordance with one embodiment of the present invention.

DETAILED DESCRIPTION OF SPECIFIC EMBODIMENTS

Figure 1A:
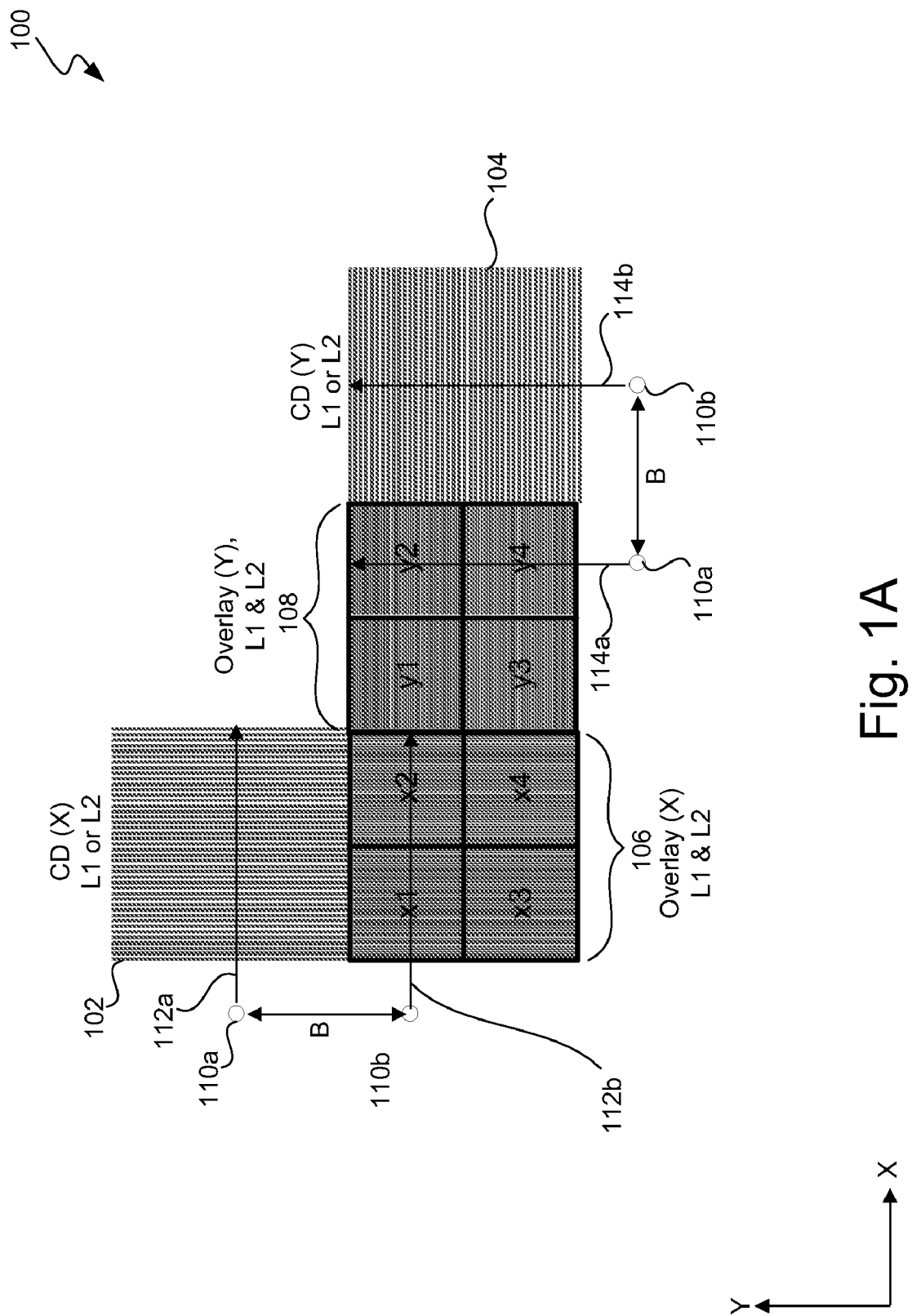
FIG. 1A~1D are diagrams of various combined overlay and CD marks, in accordance with four embodiment of the present invention.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In general, the present invention utilizes a single metrology tool for simultaneously obtaining scatterometry measurements from overlay targets and critical dimension (CD) targets. The scaterometry overlay (SCOL) measurements are used to determined overlay, while the scatterometry CD measurements are used to determined CD. The metrology tool has a dual use and can be referred to as a combination overlay and CD metrology tool. In other embodiments, two sets of overlay targets or two sets of CD targets are measured with a single metrology tool.

The combination overlay and CD metrology tool includes a SCOL measurement module and a CD measurement module. At a high level, the CD module generates a signal that corresponds to the edges of a structure, which edges can be measured to determine CD. The SCOL measurement module obtains a measured spectra from a plurality of grating type targets and then determines overlay based on this measured spectra. Certain approaches to determining overlay from scatterometry measurements concentrate on comparison of the measured spectra to calculated theoretical spectra based on model shape profiles, overlay, and film stack, and material optical properties (n,k dispersion curves), or comparison to a reference signal from a calibration wafer. Other approaches determine overlay directly from the measured spectra without reference to a simulated or reference spectra, and several embodiments of such an approach are further described below.

The two modules of the metrology tool generate two optical beams that are separated by a "bore" distance B. For example, the B distance can be between about 5 and 40 μm. To efficiently utilize this combination tool to measure an overlay and CD target, 2 overlay targets, or 2 CD targets, the targets to be measured are designed to have a separation that substantially matches the bore distance B.

Several examples of combined CD and Overlay targets and techniques for measuring such targets will first be described. Next, combination CD/Overlay metrology systems will be generally described, and then several specific combination CD/Overlay metrology systems will be described. Finally, several specific SCOL techniques which do not require calibration wafers or simulated spectrum are also described.

Combined CD and Overlay Marks

In a scatterometry overlay (SCOL) determination procedure as described in detail below, the target area may include four gratings for each axis (X and Y). Each of these gratings is typically larger than 15×15 um. Each grating is composed of a first layer grating (e.g. STI or shallow trench isolation) and a top layer grating (e.g. gate resist). One of the two layers has a programmed offset to facilitate overlay determination without comparison of the measured spectra to a reference as described further below, and this offset is typically smaller than the pitch of the top grating. In many cases the top layer is photoresist. An overlay measurement is achieved by analyzing the spectra of a reflected light from each of these four gratings.

In scatterometry critical dimension (CD) or scatterometry profile measurement, the target area typically consists of a single grating or periodic structure, which may be positioned along either axis (X or Y). In some cases, the target area may include multiple gratings for each axis (X and Y). Each of these gratings is typically about 50×50 um. The measurement is typically performed on a single process layer target with no pattern underneath following completion of a L1 patterning step. This measurement is typically done on a photoresist pattern following a resist development step in a lithographic patterning process or following an etch or CMP process in other modules of the wafer fabrication process. A CD or scatterometry profile measurement is achieved by analyzing the spectra of a reflected light from the grating(s) as described in, for example, U.S. Pat. No. 6,590,656 by Xu, et al., which patent is incorporated herein by reference in its entirety.

Any suitable type of overlay and CD/profile targets may be combined together so as to be measurable by a combination tool having a bore distance B. FIG. 1 is a top view diagram of a combined overlay and CD mark 100, in accordance with one embodiment of the present invention. The combined mark 100 includes both CD and overlay targets. As shown, the combination mark includes an X direction CD target 102, a Y direction CD target 104, a set of X direction overlay targets 106 (x1~x4), and a set of Y direction overlay targets 108 (y1~y4). The scatterometry CD targets 102 and 104 can be formed in either a first layer L1 or a second top layer L2, while the overlay targets 106 and 108 are formed from both a first layer L1 and a top layer L2. The top layer L2 structures of the overlay targets 106 and 108 are formed over the bottom layer L1 structures, which cannot be seen in the Figure. As described further below, the top layer L2 structures of the overlay targets have a predefined offset from the corresponding underlying layer L1 structures.

The configuration of the scatterometry CD/profile targets and scatterometry overlay targets may be widely varied. In the illustrated embodiment, the two CD targets 102 and 104 are formed from a grating oriented in either the X or Y direction. By way of example, the X direction CD target 102 includes vertical lines, while the Y direction CD target includes horizontal lines. The X direction overlay targets 106 include four gratings with vertical lines x1~x4, while the Y direction overlay targets 108 include four gratings with vertical lines y1~y4.

The overlay in the Y direction is determined by the shift produced between the corresponding lines of the Y structures in L2 (e.g., y1~y4) and the Y structures in L1 (not shown), while the overlay in the X direction is determined by the shift produced between the corresponding lines of the X structures in L2 (e.g., x1~x4) and the X structures in L1 (not shown). The vertical lines, for example, may be used to determine X overlay and the horizontal lines, for example, may be used to determine Y overlay. In an alternative embodiment, L1 or L2 pattern may be periodic structures comprised of line segments, cylindrical holes or features (contact or via holes in resist or filled contacts, for example), device-like structures, and the like.

In all overlay arrangements, a scatterometry signal is obtained for each of the four periodic or grating on each layer L1 and L2. A combined, dual beam metrology tool can be used to simultaneously obtain spectra from two sets of targets. For example, when spectra is obtained from a particular overlay grating on a same layer as the CD gratings, spectra from one of the CD gratings may also be obtained at the same time. In the illustrated combined target 100, two beams 110a and 110b having a bore distance B are together scanned across the X direction CD grating 102 and two of the X direction overlay gratings x1 and x2 along paths 112a and 112b, respectively. The spectra from the first beam 110a is used to measure CD or profile, while the second beam 110b is used to determine overlay in conjunction with spectra obtained separately from the x3 and x4 gratings and their underlying gratings (which reside beneath each of x1~x4).

Figure 1B:
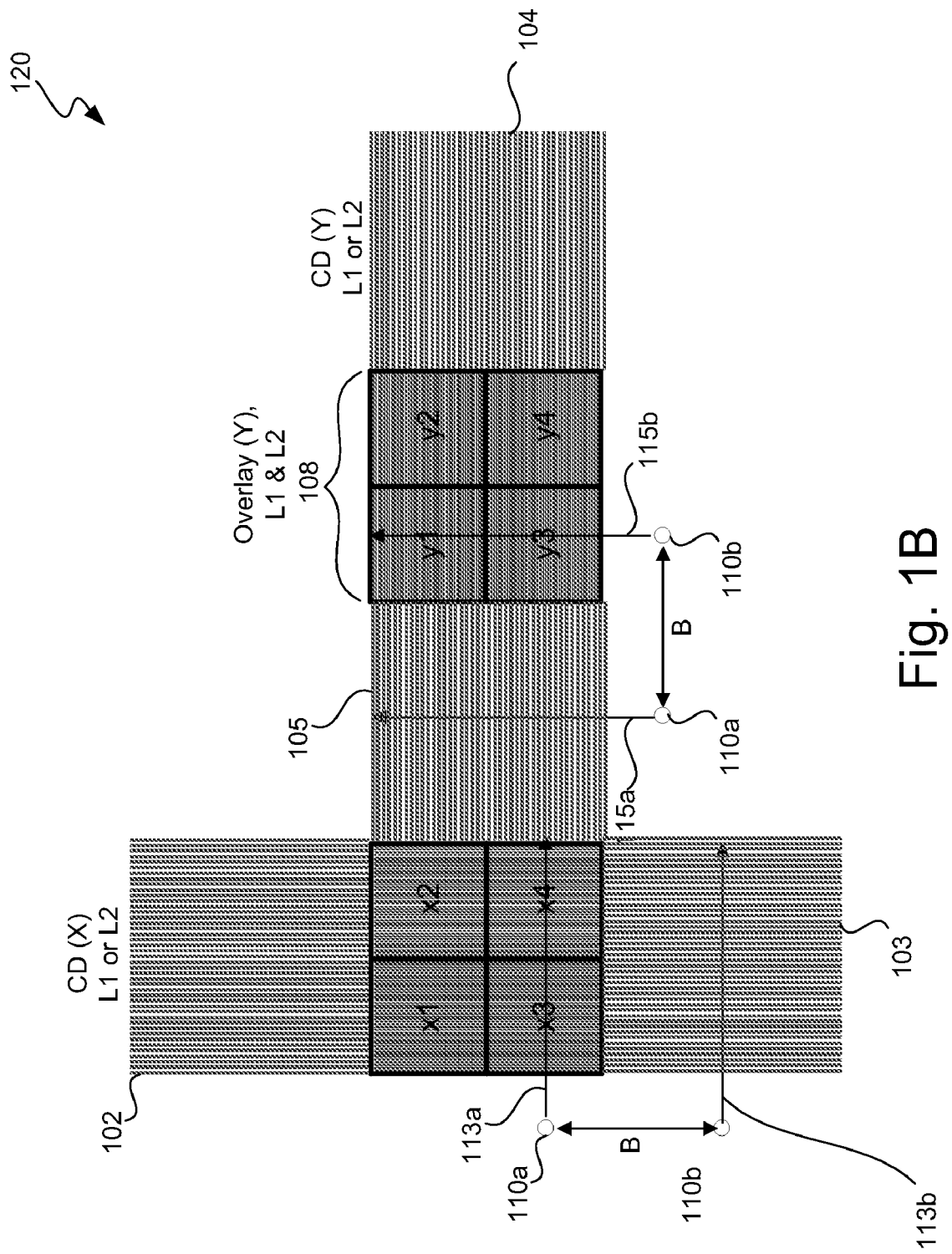

Since the spectra is used from four or more overlay gratings to determine overlay in embodiments of a SCOL technique described herein, the other two X direction gratings x3 and x4 are also scanned to obtain spectra so as to be analyzed together with the spectra from x1 and x2. (Actually, embodiments of SCOL that do not require reference spectra can also be implemented with three or more targets as described below in one example). An additional X direction CD target may also be placed below these two overlay gratings (x3 and x4) so that when the first beam 110a is scanned across x3 and x4 gratings, the second beam 110b is also scanned across this additional CD target. Such an alternative combined target is illustrated in FIG. 1B. As shown, combined target 120 includes a second X direction CD grating 103 that can be simultaneously scanned with beam 110b along path 113b, while the second set of X direction overlay gratings are scanned by beam 110a along path 113a, while the overlay gratings x3 and x4 are scanned by beam 110a along path 113a. Of course, the second set of X direction gratings x3 and x4 may simply be scanned by themselves without scanning another CD grating at the same time (as would be the case for the combined target 100 of FIG. 1A).

Referring back to FIG. 1A, a similar process may be undertaken with the Y direction CD and overlay gratings. As shown, the beam columns are rotated 90 degrees in relation to the combined targets (typically, the targets are rotated below the beam columns). The first beam 110a is then scanned along path 114a across Y direction overlay gratings y4 and y2 at the same time that the second beam 110b is scanned along path 114b across Y direction CD gratings 104. The spectra obtained from the first path 114a from gratings y4 and y2, in conjunction with spectra obtained from gratings y1 and y3 and their underlying gratings (which reside beneath each of y1~y4, is used to determine overlay, while the spectra obtained from the second path 114b is used to measure CD/profile of the gratings.

In the alternative embodiment of FIG. 1B, an additional Y direction CD grating 105 may be inserted between the Y direction overlay structures and the X direction overlay structures x2 and x4. Accordingly, the first beam 110a may be scanned along path 115a over CD grating 105, while the second beam 110b is simultaneously scanned along path 115b over Y direction overlay targets y1 and y3. Of course, the second set of Y direction gratings y1 and y3 (e.g., in the target 100 of FIG. 1A) may simply be scanned by themselves without scanning another CD grating at the same time.

Figure 1C:
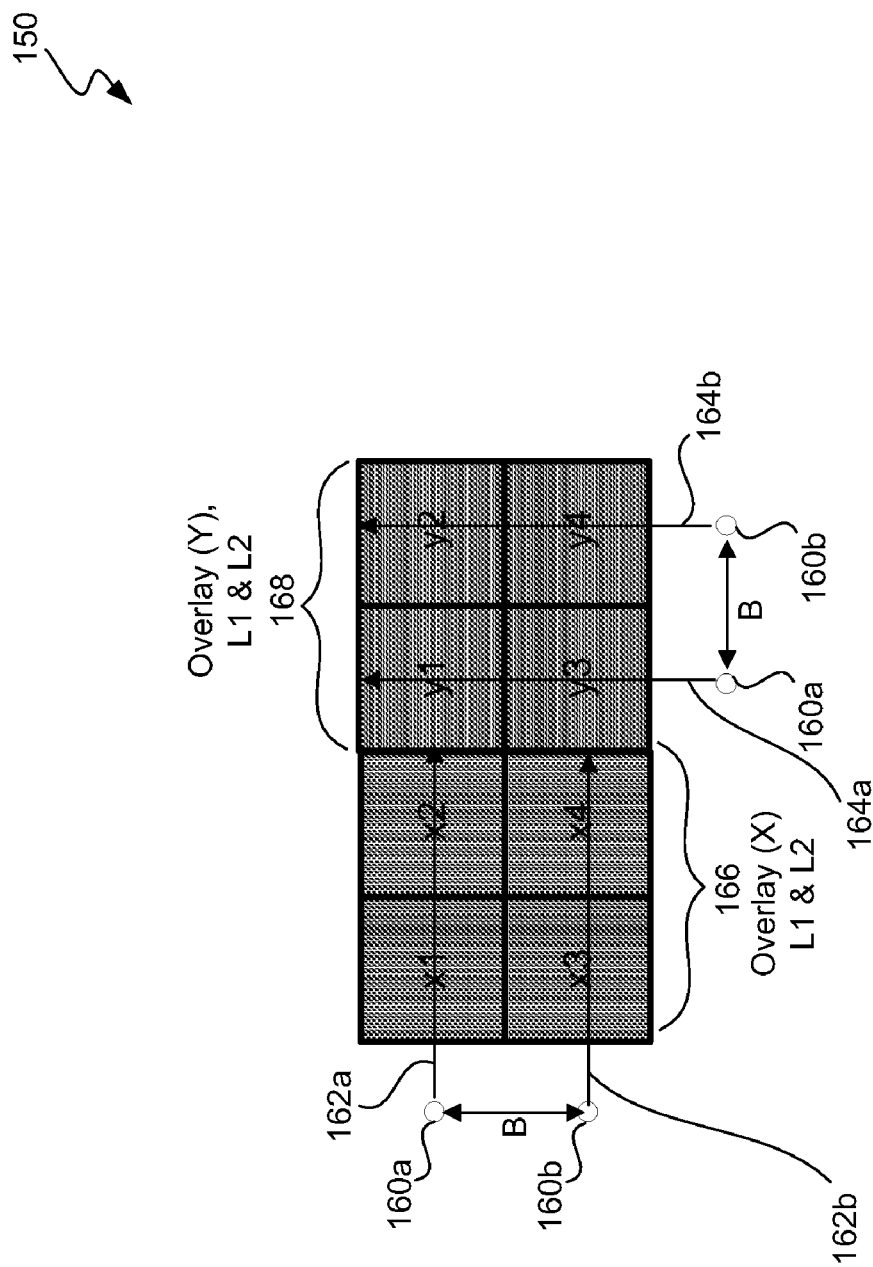

In another embodiments, the first and second beams 110a and 110b may be scanned substantially simultaneously across all four overlay gratings, rather than a set of overlay and CD gratings. Such a technique and corresponding target 150 is illustrated in FIG. 1C. As shown, a first beam 160a has a bore distance B from a second beam 160b. These beams 160 may be simultaneously scanned along two sets of overlay gratings, the four X direction gratings 166 or the four Y direction gratings 168. As shown, beam 160a can be scanned along path 162a over X direction gratings x1 and x2, while beam 160b is scanned along path 162b over X direction gratings x3 and x4. Likewise, beam 160a can be scanned along path 164a over Y direction gratings y3 and y1, while beam 160b is scanned along path 164b over Y direction gratings y4 and y2.

Figure 1D:
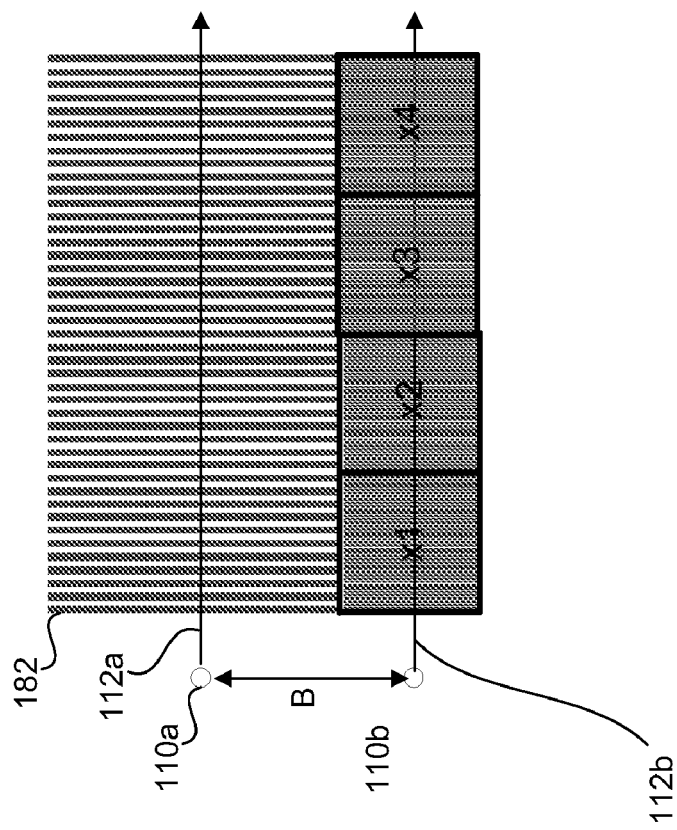

In an alternative implementation, the overlay gratings are arranged in a line as shown in FIG. 1D. As shown, overlay targets x1~x4 are arranged in a line so that beam 110b can be scanned across the four overlay targets while scanning across the CD target 182. Beam 110b traverses along path 112b across overlay targets x1~x4, while beam 110a traverses along path 112a across CD target 182.

Dual Use Metrology Systems and Techniques

According to various embodiments of the present invention, a single scatterometry metrology tool is used to measure two metrology targets together. In one embodiment, a CD and overlay target are measured together. In a second embodiment, two CD targets are measured together. In a third embodiment, two overlay targets are measured together. Although two measurements are described herein, of course, more than two measurements may also be obtained with a single metrology system having a corresponding number of beam columns.

The established methods of measuring critical dimensions and overlay commonly require scheduling and operating separate measurement systems. One disadvantage of the established methods of measuring critical dimensions and overlay on separate measurement systems is the additional time required to schedule and run separate operations on separate metrology tools. Another disadvantage is the redundancy of common parts and the costs associated therewith.

In order to overcome these disadvantages, a metrology system that combines Scatterometry Overlay and CD may be utilized. In one embodiment, a scatterometry overlay measurement system includes two optical heads or beam columns, one for overlay and one for CD. In operation, a wafer, a group of wafers, or batch of multiple wafers may be introduced to the combined metrology system by loading the wafer container onto the robotic wafer handling system dedicated to this combined metrology system. Measurement recipes may be selected specifying CD measurements on some or all of the wafers and scatterometry overlay measurements on some or all of the wafers. The CD measurements and the SCOL measurements may be specified together in one or more recipes, or may be specified in separate recipes. In embodiments of the present invention, the CD and SCOL measurements are extracted from the same wafers. One example of the combined metrology system includes two scatterometry measurement systems, each capable of scatterometry overlay measurements (such as a spectroscopic ellipsometer, spectroscopic polarized reflectometer, or +/−1 order diffraction scatterometer), such as any of optical scatterometry metrology tools manufactured by KLA-Tencor of San Jose, Calif.

One advantage of using a combined CD and SCOL metrology system is a significant reduction in overall time required to complete scheduling and/or perform the scatterometry CD and overlay measurements. At least one queue delay time may be eliminated. Performing CD and overlay measurements in parallel can save at least part of the time required for separate measurement operations. Time savings are also provided when using a single metrology tool to measure two sets of CD targets or two sets of overlay targets.

Figure 2A:
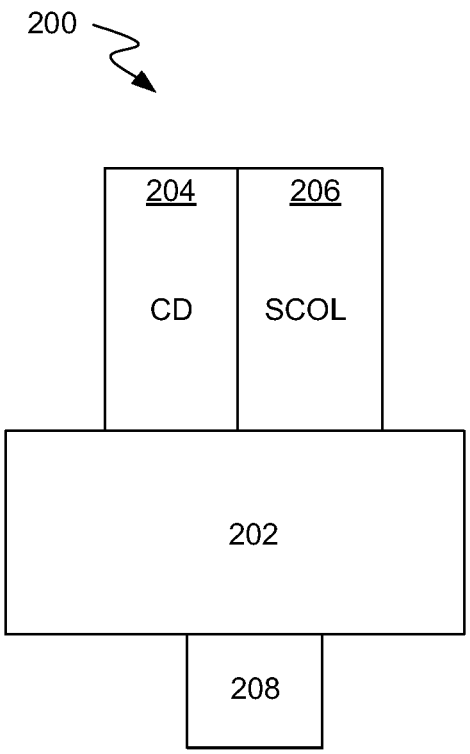
FIG. 2A~2C are block diagrams illustrating combined metrology tools, in accordance with three embodiment of the present invention.
Figure 2B:
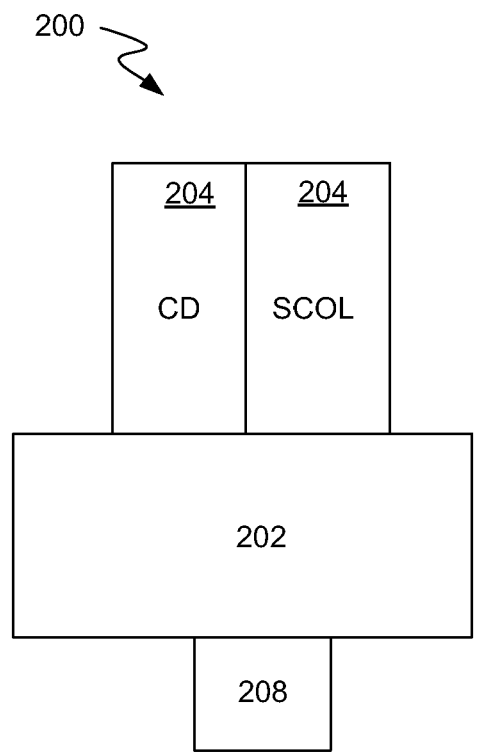
Figure 2C:
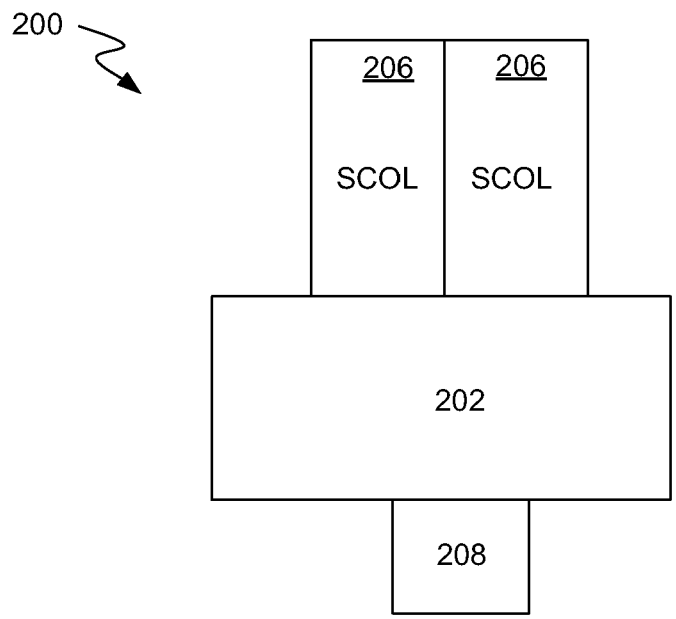

FIGS. 2A~2C are block diagrams illustrating various configurations of a combined metrology tool 200, in accordance with one embodiment of the present invention. In all the figures, the combined metrology tool 200 includes a robotic wafer handling system 202 and a wafer load position 208. In each Figure, the tool 200 is configured differently. That is, each of its two beam columns are configured to perform CD or scatterometry overlay (SCOL), and each of its processors are programmed to determine CD or SCOL from one or more obtained scatterometry signal(s)

FIG. 2A shows the tool 200 configured as a scatterometry CD measurement module 204 and a SCOL measurement module 206. FIG. 2B shows the tool 200 configured as two scatterometry CD measurement modules 204, while FIG. 2C illustrates the tool configured as two SCOL measurement modules 206. In general, each module is in the form of a optical beam column that may be configured (e.g., via a recipe) to measure either CD or overlay. These figures depict different "logical" configurations o a metrology tool. That is, the SCOL and CD modules may not physically differ from each other, but may simply have different recipe configurations. Of course, each module may have different physical components, for example, as described in the system of FIG. 4A.

The robotic wafer handling system 202 is configured to transfer wafers to and from being positioned under the two configured modules (e.g., 204 and 206, 204 and 204, or 206 and 206) for simultaneous measurement by both modules, as well as to and from the wafer load position 208.

The scatterometry CD module 204 is configured to measure the critical dimensions that may include, for example, linewidth, top linewidth, via diameter, sidewall angle and profile. The scatterometry overlay module 206 is configured to measure the overlay, as for example between two layers disposed on the wafer. The wafer load position 208 is configured to hold one or more wafers. In most cases, it holds a plurality of wafers. The wafers may be from the same lot or from a different lot.

In one operation applied to FIG. 2A, some of the wafers from wafer load position 208 have critical dimensions measured by the CD module 204 and overlay spectra obtained by the overlay module 206 at the same time. The wafer can be measured by both modules without being removed from the system, i.e., the wafer handling as well as the throughput issues associated therewith are reduced. In another operation, some wafers from wafer load position 208 have critical dimensions measured by the CD module and some other wafers from wafer load position 208 have overlay measured by the SCOL module. In any of these operations, the CD and SCOL modules can proceed independently and simultaneously. These different operations may each be also applied to two CD modules or 2 SCOL modules.

Figure 3:
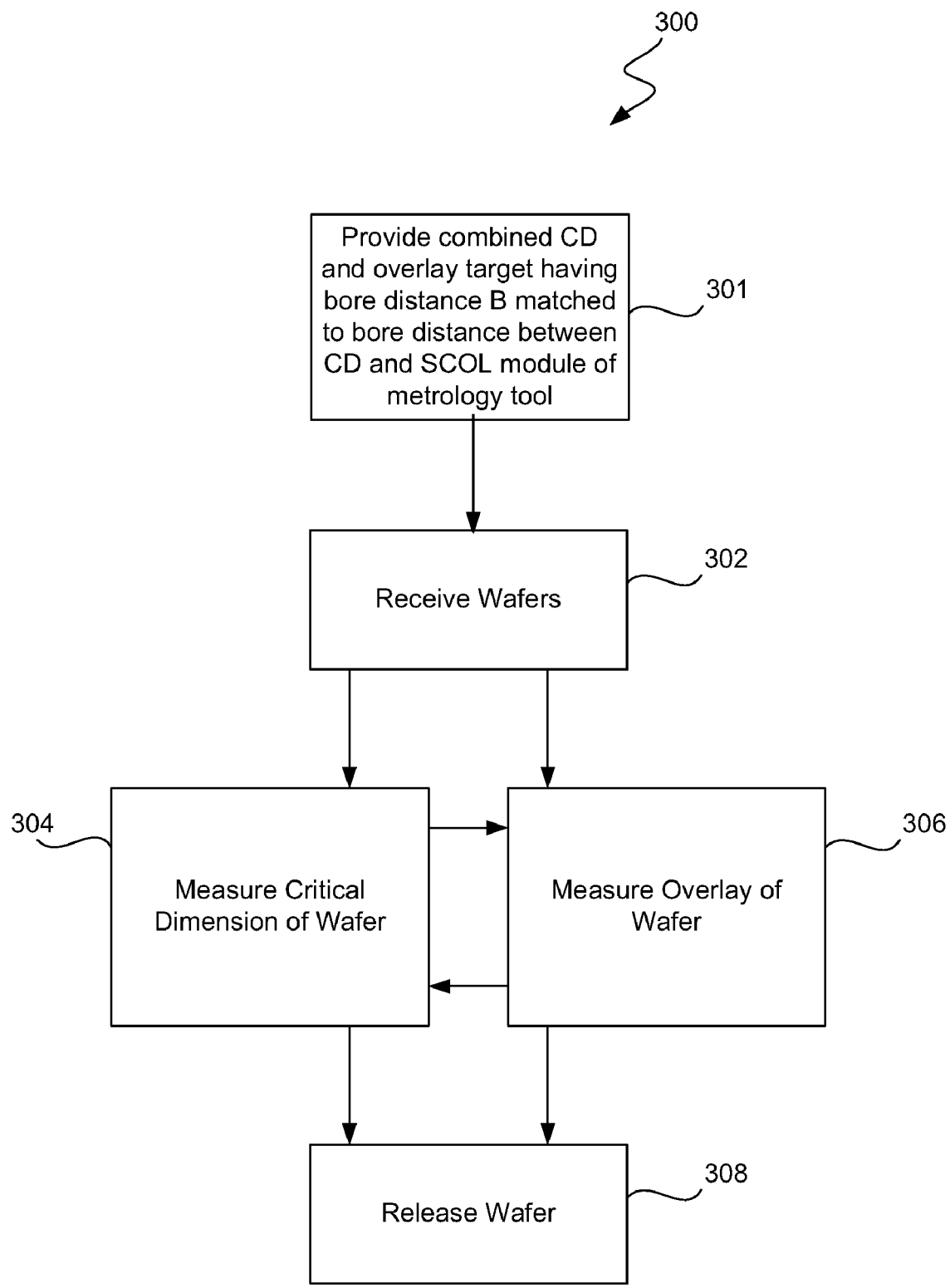
FIG. 3 is a flow diagram using a combined metrology tool, in accordance with one embodiment of the present invention.

FIG. 3 is a flow diagram 300 using a combined metrology tool, in accordance with one embodiment of the present invention. Initially, a combined CD and overlay target having bore distance B that substantially matches the bore distance between a CD and SCOL module of a particular metrology tool is provided in operation 301. That is, a combined CD and overlay target is designed so that the distance between a measured CD target and a measured SCOL target substantially matches the bore distance between the two corresponding measurement columns on a specific metrology tool. Alternatively, the combined target can simply include two sets of CD or SCOL targets that are separated by a distance that substantially matches the bore distance.

A group of wafers having such combined targets thereon can then be received by the metrology tool. By way of example, the wafers may be a wafer lot that is loaded at position 208 in FIG. 2. Following step 302, the process flow 300 proceeds to step 304 where the critical dimensions of a wafer from the group of wafers is measured. The process flow 300 also proceeds to step 306 where the overlay measurements are obtained from a wafer from the group of wafers by a SCOL measurement instrument. At least a portion of steps 304 and 306 is performed at the same time on the same wafer. For instance, CD may be obtained from a CD grating while the spectra from two overlay gratings are obtained for use in determining overlay. The transferring of the wafer may for example be performed by the robotic system shown in FIG. 2. When all the measurements are performed, the process flow proceeds to step 308 where the group of wafers are released from the metrology tool.

Figure 4A:
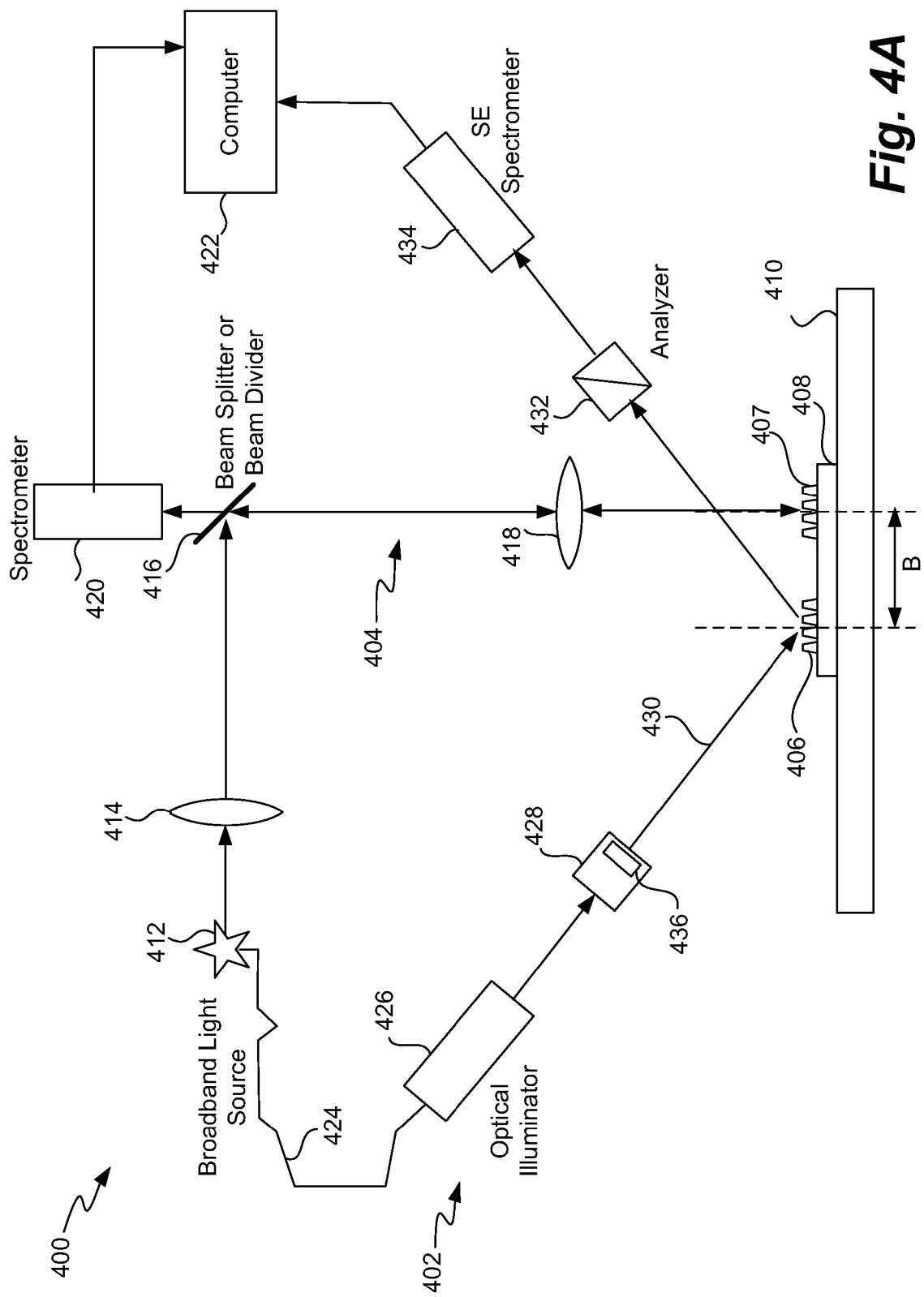
FIG. 4A is a detailed schematic view of a combination CD and Overlay system in accordance with one embodiment of the present invention.

FIG. 4A is a schematic view of a dual use spectroscopic scatterometer system 400, in accordance with one embodiment of the present invention. The system 400 combines the features of a spectroscopic ellipsometer 402 and spectroscopic reflectometer 404, each of which may be used for measuring overlay or CD of two grating structures 406 and 407 disposed on a substrate or wafer 408. As shown, the column of bore of the ellipsometer 402 is separated from the bore of the reflectometer by bore distance B. The two gratings have a distance from each other that substantially matches the bore distance B. The grating structures 406 and 407 may, for example, correspond to any of those grating structures described herein.

Both the spectroscopic ellipsometer 402 and spectroscopic reflectometer 404 may utilize a stage 410, which is used for moving the substrate 408 in the horizontal xy directions as well as the vertical z direction. The stage may also rotate or tilt the substrate. In operation, the stage 410 moves the substrate 408 so that the grating structure 406 can be measured by the spectroscopic ellipsometer 402 while the grating structure 407 can be measured by the spectroscopic reflectometer 404, and visa versa.

The spectroscopic ellipsometer 402 and spectroscopic reflectometer 404 also utilize one or more broadband radiation sources 412. By way of example, the light source 412 may supply electromagnetic radiation having wavelengths in the range of at least 230 to 800 nm. Examples of broadband light sources include deuterium discharge lamps, xenon arc lamps, tungsten filament lamps, quartz halogen lamps, and light emitting diodes (LEDs). Alternatively, one or more laser radiation sources may be used instead of or in combination with the broadband light source. In the case where the signal is collected at only one or a few wavelengths, the system may not be considered a spectroscopic ellipsometer but may be referred to as a single wavelength (or multi-wavelength) ellipsometer.

In the spectroscopic reflectometer 404, a lens 414 collects and directs radiation from source 412 to a beam splitter 416, which reflects part of the incoming beam towards the focus lens 418, which focuses the radiation onto one of the gratings of substrate 408, such as in the vicinity of the grating structure 407. The light reflected by the substrate 407 is collected by the lens 418, passes through the beam splitter 416 to a spectrometer 420. The spectral components are detected and signals representing such components are supplied to the computer 422, which computes the overlay and/or CD in any of the manners described herein.

In the spectroscopic ellipsometer 402, the light source 412 supplies light through a fiber optic cable 424, which randomizes the polarization and creates a uniform light source for illuminating one of the gratings of the substrate 408, such as grating 406. Upon emerging from the fiber 424, the radiation passes through an optical illuminator 426 that may include a slit aperture and a focus lens (not shown). The light emerging from the illuminator 426 is polarized by a polarizer 428 to produce a polarized sampling beam 430 illuminating the grating 406 of substrate 408. The radiation emerging from the sampling beam 430 reflects off of the grating 406 of substrate 408 and passes through an analyzer 432 to a spectrometer 434. The spectral components of the reflected radiation are detected and signals representing such components are supplied to the computer 422, which computes the overlay and/or CD in any of the manners described herein.

In the spectroscopic ellipsometer 402, either the polarizer 428 or the analyzer 432 or both may include a waveplate, also known as compensator or retarder (not shown). The waveplate changes the relative phase between two polarizations so as to change linearly polarized light to elliptically polarized light or vice versa.

In order to collect more information about the interaction of the incident polarized light 430 with the sample, it may be desirable to modulate the polarization state of the light or modulate the polarization sensitivity of the analyzer or both. Typically this is done by rotating an optical element within the polarizer and/or analyzer. A polarizing element within the polarizer or analyzer may be rotated, or, if at least one of those assemblies contains a waveplate, the waveplate may be rotated. The rotation may be controlled by the computer 422 in a manner known to those skilled in the art. Although the use of a rotating element may work well, it may limit the system 402. As should be appreciated, the use of rotating elements may be slow, and because there are moving parts they tend to be less reliable.

In accordance with one embodiment, therefore, the polarizer 428 is configured to include a polarization modulator 436, such as photoelastic modulator (PEM), in order to produce a fast and reliable spectroscopic ellipsometer. The polarization modulator replaces the rotating waveplate. The polarization modulator 436 is an optical element that performs the same function as a rotating waveplate, but without the costly speed and reliability problems. The polarization modulator 436 allows electrical modulation of the phase of the light without mechanically rotating any optical components. Modulation frequencies as high as 100 kHz are readily attainable.

In an alternative embodiment, the analyzer 432 is configured to include a polarization modulator such as a PEM (Photoelastic Modulator) that can be modulated electrically. In yet another embodiment, both the polarizer and analyzer contain polarization modulators, such as PEMs, that are modulated at different frequencies.

Because the polarization modulator 436 can modulate at such a high frequency, the polarization modulator 436 may be used to perform various techniques, which would otherwise be too slow. For example, the difference between the polarized reflectivity of two structures may be obtained. To do this, a PEM may be combined with an acoustic optical modulator (AOM), where the AOM rapidly moves between the two structures while modulating the polarization state at a different (but related, such as multiple or submultiple) frequency. Signals at the sum and the difference of the PEM and AOM modulation frequencies contain useful information and can be detected with high signal-to-noise by synchronous detection. Alternatively the AOM on the incident beam could be used in combination with a PEM in the analyzer.

Although not shown, the rotating waveplate may also be replaced by a polarization modulator in other types of scatterometric systems as for example a polarization sensitive reflectometer.

Any suitable scatterometry optical dual system may be utilized to measure two overlay and/or CD targets. For instance, the system may include two spectroscopic ellipsometer or two spectroscopic reflectometers. Another optical system that may be used for scatterometry overlay measurements is a differential reflectometer or differential ellipsometer for detecting the +/−1 diffraction orders as described in U.S. patent application Ser. No. 09/833,084 by Abdulhalim et al. which is incorporated herein by reference.

In a more detailed list, any combination of the following instruments may be used to collect optical signals from an overlay and/or CD target: a scanning reflectometer system, a system with two or more reflectometers capable of parallel data acquisition, a system with two or more spectroscopic reflectometers capable of parallel data acquisition, a system with two or more polarized spectroscopic reflectometers capable of parallel data acquisition, a system with two or more polarized spectroscopic reflectometers capable of serial data acquisition without moving the wafer stage or moving any optical elements or the reflectometer stage, a scanning ellipsometer system, a system with two or more ellipsometers capable of parallel data acquisition, a system with two or more ellipsometers capable of serial data acquisition without moving the wafer stage or moving any optical elements or the ellipsometer stage, a Michelson interferometer, and a Mach-Zehnder interferometer, a Sagnac interferometer, a scanning angle of incidence system, and a scanning azimuth angle system. Several embodiments for measuring scatterometry are further described in the above referenced co-pending U.S. patent application Ser. No. 10/785,396, which application is incorporated herein by reference it is entirety.

In a specific implementation, a multi-spot system may be used to achieve two spots that illuminate the same grating in an Azimuth angle of 90 degrees. These Azimuth two spots can also illuminate near each other. This two spot arrangement may be achieved on each set of gratings. That is, two spots at an Azimuth angle of 90 degrees illuminate an overlay grating, while two spots at an Azimuth angle of 90 degrees illuminate a CD grating. Alternatively, two spots illuminate a first ovleray grating (or CD grating), and the other two spots illuminate a second overlay grating (or CD grating).

Figure 4B:
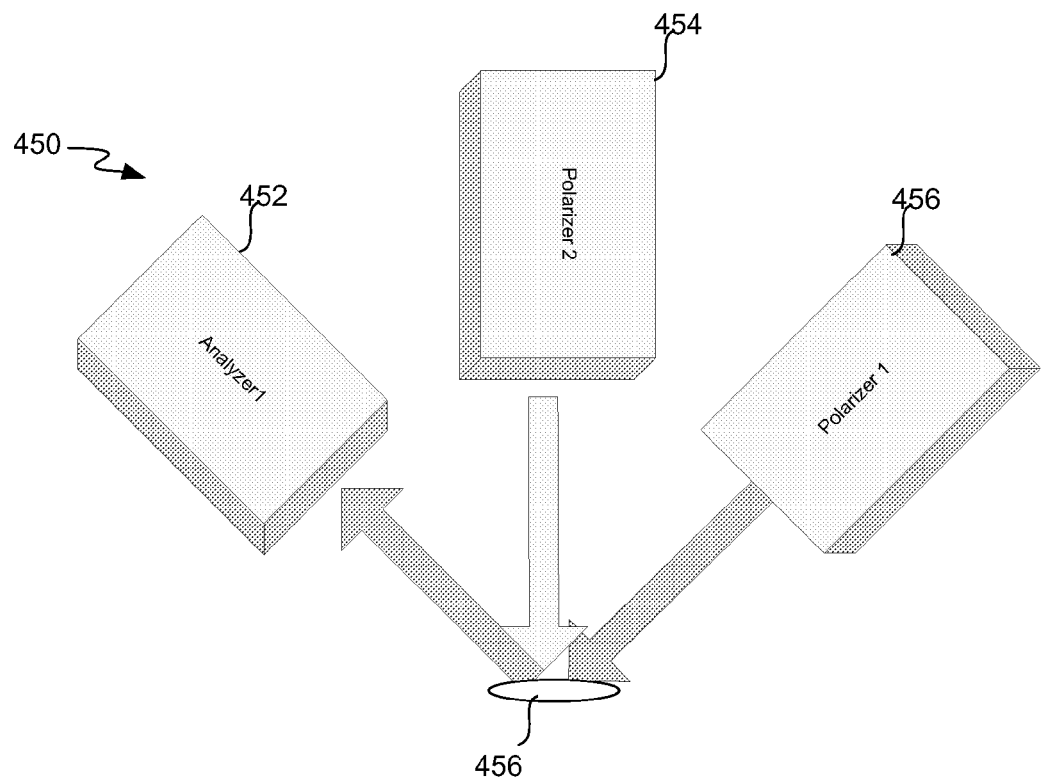
FIG. 4B is a diagrammatic representation of a scatterometry system 450 arranged to illuminate two spots on a same grating at an Azimuth angle of 90 degrees in accordance with a first implementation.

FIG. 4B is a diagrammatic representation of a scatterometry system 450 arranged to illuminate two spots on a same grating at an Azimuth angle of 90 degrees in accordance with a first implementation. As shown, the system 450 includes a first polarizer 454 and a second polarizer 456 for directing two optical incident beams at an Azimuth angle of 90 degrees towards a same or near a same illumination area 456. An output beam that is produced from the sample in response to the two incident beams is received into analyzer 452. This system may be combined with any other measurement module described herein to measure another grating (overlay or CD).

Figure 4C:
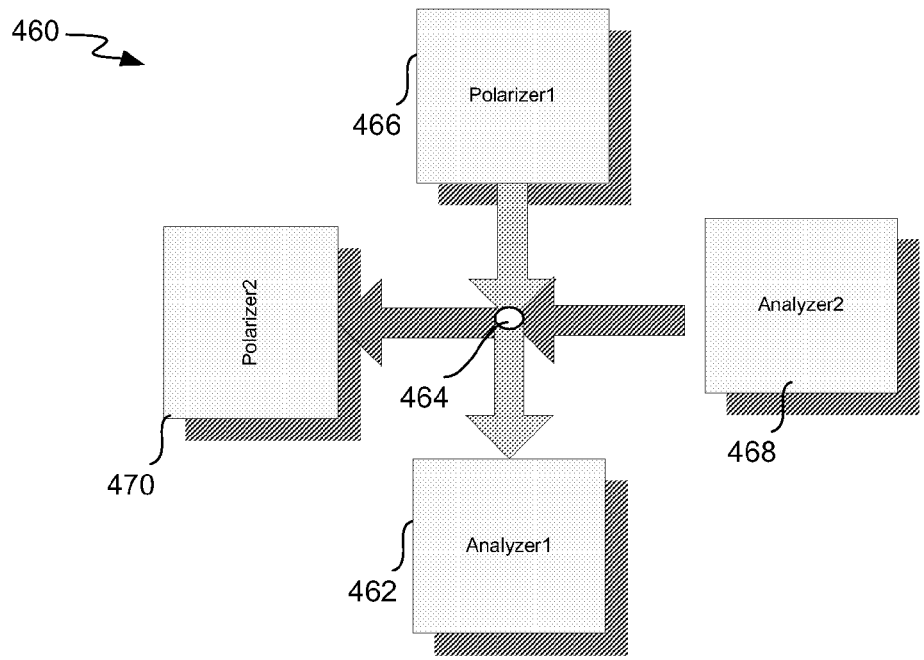
FIG. 4C is a diagrammatic representation of a scatterometry system 450 arranged to illuminate two spots on a same grating at an Azimuth angle of 90 degrees in accordance with a second implementation.

FIG. 4C is a diagrammatic representation of a scatterometry system 460 arranged to illuminate two spots on a same grating at an Azimuth angle of 90 degrees in accordance with a second implementation. As shown, the system 460 includes a first polarizer 466 and a second polarizer 468 for directing two incident beams at an Azimuth angle of 90 degrees towards a same target area or near a same target 464. The azimuth angle is the angle between the two beams incident the sample on the wafer. Two output beams that are produced in response to the incident beams are then received by two analyzers 470 and 462. This system may be combined with any other measurement module described herein to measure another grating (overlay or CD).

SCOL Techniques

One implementation of a scatterometry overlay (SCOL) technique which is referred to herein as the "linear approach" will first be described. Alternative SCOL approaches, such as a "phase approach" are also described. In embodiments of the present invention, the SCOL technique described below may be practiced on two sets of overlay targets or in conjunction with measuring CD on a parallel CD target.

In a specific SCOL technique, a set of four scatterometry overlay targets are provided (although in other embodiments more or less than four may be used), which have been formed on a sample or workpiece, such as a semiconductor device. A pattern could also be described as a "pattern or interlayer pattern", with the two terms being synonymous under most circumstances. In a particular implementation, the sample has two or more layers of a semiconductor device, and the targets are utilized to provide a measure of the placement accuracy of various structures comprised in the device. Commonly, placement accuracy is characterized by measurement of an overlay error between two different layers of the semiconductor device. More generally, overlay error can be measured between two different patterns generated by different pattern exposure steps.

In the illustrated technique, a set of four targets are provided, and each target includes two sets of structures on two different layers which are offset from each other. In a specific implementation, an offset may be defined as the sum or the difference of two separate distances: a first distance F and a second distance f0, with F being greater than f0. Denoting the four targets as "target A", "target B", "target C" and "target D", the corresponding predetermined offsets for each of these targets may be defined as follows for a specific target design:

$Xa = +F + f0$ (for target A), $Xb = -F + f0$ (for target B), $Xc = +F-f0$ (for target C), and $Xd = -F-f0$ (for target D).

The offsets for Xa through Xd may be any suitable value for practicing the techniques of the present invention so as to determine overlay. For example, Xa and Xb may have different values of f0 than Xc and Xd.

Figure 5:
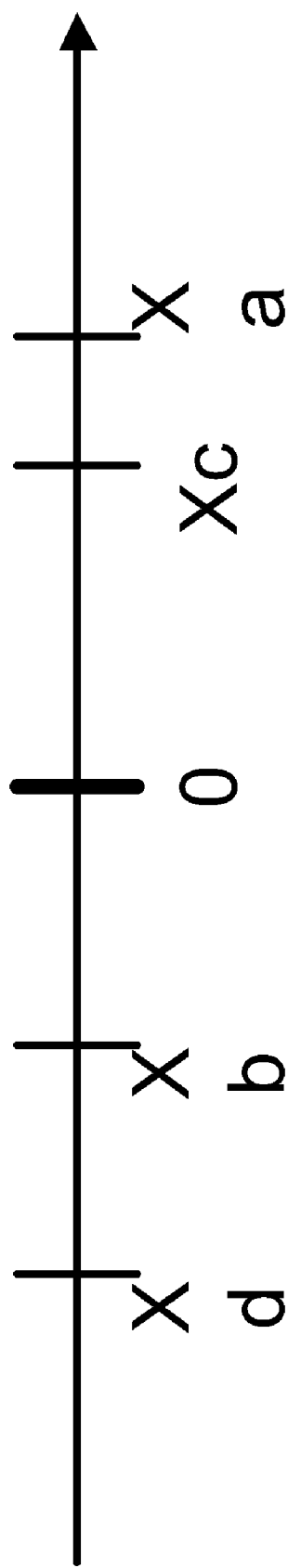
FIG. 5 illustrates the relative distribution of designed overlay offsets Xa, Xb, Xc, and Xd for corresponding interlayer patterns (overlay targets) A, B, C, and D according to an embodiment of the present invention.

FIG. 5 illustrates the distribution of offsets Xa, Xb, Xc and Xd along the x axis in a particular implementation of the invention. As shown, offsets Xa and Xc are both positive with Xa being larger than Xc. In contrast, offsets Xb and Xd are both negative with Xd being more negative than Xb. The offsets may be defined from a position in the unit cell of the first structure. If a symmetry position exists in the unit cell, it may be preferable to define the offsets from the symmetry position. Alternatively, the offsets may be defined from a position in the unit cell of the second structure but care should be taken to agree with the convention of overlay measurements being defined as the position of the L2 pattern (or second exposed pattern) measured with respect to the position of the L1 pattern (or second exposed pattern).

The number of targets and the magnitude and sense of their corresponding offsets may be chosen in any suitable manner so that the techniques of the present invention may be practiced to determine overlay error. A specific set of targets and their corresponding offsets are described below in relation to FIGS. 6(a) through 6(f). It should be readily apparent that there are numerous combinations of targets and offset values which may be utilized to practice the techniques and utilize the systems of the present invention.

FIG. 6(a) is a side view illustration of a patterned top layer L2 being offset by an amount F from a patterned bottom layer L1 in accordance with one embodiment of the present invention. Each layer L1 and L2 is patterned into a set of structures. A structure may include any suitable feature, such as a line, trench or a contact. A structure may be designed to be similar to a semiconductor device feature. A structure may also be formed from a combination of different features. Further, a structure may be located on any layer of the sample, e.g., either above the top layer of the sample, within any layer of the sample, or partially or completely within a layer of the sample. In the illustrated embodiment of FIG. 6(a), layer L1 includes the complete structures 604a-c, while layer L2 includes the complete structures 602a-c. Construction of scatterometry overlay targets structures and methods for producing them are described in U.S. patent application, having application Ser. No. 09/833,084, filed 10 Apr. 2001, entitled "PERIODIC PATTERNS AND TECHNIQUE TO CONTROL MISALIGNMENT", by Abdulhalim, et al., which application is herein incorporated by reference in its entirety.

As shown, the structures of the top layer L2 are offset by an amount F from the structures of the bottom layer L1. The structures of the two offset layers may be located within adjacent layers or have any suitable number and types of layers disposed in between the two offset layers. FIG. 6(a) also shows three films T1, T2, and T3 between patterned layers L1 and L2 and their corresponding structures. To the extent that any other layers exist between the two layers having the structures, these other layers exhibit at least a minimum degree of transmission for electromagnetic radiation to permit propagation of the radiation between the layers having the structures.

FIG. 6(b) is a side view illustration of a patterned top layer L2 being offset by an amount −F from a patterned bottom layer L1 in accordance with one embodiment of the present invention. FIG. 6(c) is a side view illustration of a patterned top layer L2 being offset by an amount +F+f0 from a patterned bottom layer L1 in accordance with one embodiment of the present invention. In one embodiment offset Xa corresponds to +F+f0. FIG. 6(d) is a side view illustration of a patterned top layer L2 being offset by an amount −F+f0 from a patterned bottom layer L1 in accordance with one embodiment of the present invention. In one embodiment offset Xb corresponds to −F+f0. FIG. 6(e) is a side view illustration of a patterned top layer L2 being offset by an amount +F+f0+E from a patterned bottom layer L1 in accordance with one embodiment of the present invention. FIG. 6(f) is a side view illustration of a patterned top layer L2 being offset by an amount −F+f0+E from a patterned bottom layer L1 in accordance with one embodiment of the present invention.

In general, an error offset E in one direction, for example along the X-axis, may be determined by analyzing at least the measured spectra (or any type of measured signals) obtained from four targets A, B, C, and D each having offsets between two patterned layers, such as offsets Xa through Xd. This analysis is performed without comparing any of the spectra to a known or reference spectra (or signal) from a sample target having a known overlay error. In other words, the error determination techniques of the present invention do not require a calibration operation.

Figure 7A:
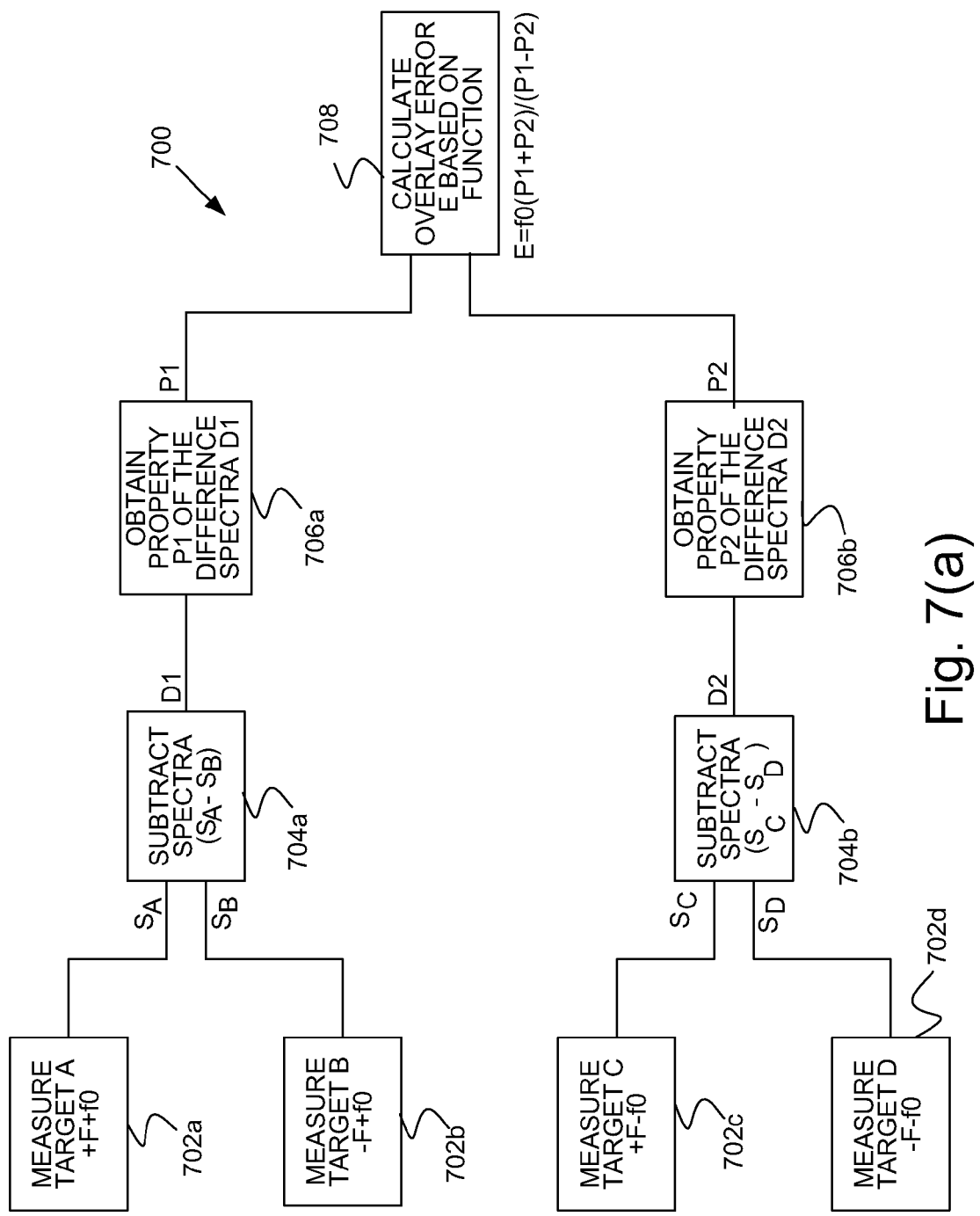
FIG. 7(a) is a flow diagram illustrating a procedure for determining overlay in accordance with one embodiment of the present invention.

FIG. 7(a) is a flow diagram illustrating a procedure 700 for determining overlay in accordance with one embodiment of the present invention. In this example, four targets A, B, C, and D are used which are designed to have offsets Xa through Xd as described above. That is, target A is designed with offset Xa=+F+f0; target B with offset Xb=−F+f0; target C with offset Xc=+F−f0; and target D with offset Xd=−F−f0.

Initially, an incident radiation beam is directed towards each of the four targets A, B, C, and D to measure four spectra $S_A$, $S_B$, $S_C$, and $S_D$ from the four targets in operations 702a through 702d, respectively. Operations 702a through 702d may be carried out sequentially or simultaneously depending on the measurement system's capabilities. Also, Operations 702a through 702d are preformed in parallel with measuring spectra from another set of one or more overlay target(s) or CD target(s). The incident beam may be any suitable form of electromagnetic radiation, such as laser, light emitting diode (LED), or broadband radiation.

Although the scatterometry techniques of the present invention are described as utilizing measured spectra from a plurality of targets, any suitable type of measurable signal obtained from an overlay target may be used to practice the techniques of the present invention. Example signals include, but are not limited to, any type of spectroscopic ellipsometry or reflectometry signals, including: $\Psi$, $\Delta$, Rs (complex reflectivity of the s polarization), Rp (complex reflectivity of the p polarization), Rs ($|r_s|^2$), Rp ($|r_p|^2$), R (unpolarized reflectivity), $\alpha$ (spectroscopic "alpha" signal), $\beta$ (spectroscopic "beta" signal), and functions of these parameters, such as $\tan(\Psi)$, $\cos(\Delta)$, ((Rs−Rp)/(Rs+Rp)), etc. The signals could alternatively or additionally be measured as a function of incidence angle, detection angle, polarization, azimuthal angle of incidence, detection azimuthal angle, angular distribution, phase, or wavelength or a combination of more than one of these parameters. The signals could also be a characterization of a combination of signals, such as an average value of a plurality of any of the above described ellipsometry and/or reflectometry signal types. The signals may alternatively take the form of a characteristic of one or more image signal(s), such an intensity value(s) or a combination (e.g., average or addition) of intensity values. Other embodiments may use monochromatic or laser light sources where at least one of the signals may be obtained at a single wavelength instead of at multiple wavelengths.

Examples of optical systems and methods for measuring scatterometry signals to determine overlay may be found in (1) U.S. patent application, having patent Ser. No. 09/849,622, filed 4 May 2001, entitled "METHOD AND SYSTEMS FOR LITHOGRAPHY PROCESS CONTROL", by Lakkapragada, Suresh, et al. and (2) U.S. patent application, having application Ser. No. 09/833,084, filed 10 Apr. 2001, entitled "PERIODIC PATTERNS AND TECHNIQUE TO CONTROL MISALIGNMENT", by Abdulhalim, et al.

After a spectra or signal is obtained from each target, spectrum $S_B(-F+f0)$ is then subtracted from spectrum $S_A(+F+f0)$, and spectrum $S_D(-F-f0)$ is subtracted from spectrum $S_C(+F-f0)$ to form two difference spectra D1 and D2 in operations 704a and 704b, respectively. Next, a difference spectrum property P1 is obtained from the difference spectra D1 and a difference spectrum property P2 is obtained from the difference spectrum D2 in operations 706a and 706b, respectively. The difference spectra properties P1 and P2 are generally obtained from any suitable characteristic of the obtained difference spectra D1 and D2. The difference spectra properties P1 and P2 may also each simply be a point on the each difference spectra D1 or D2 at a particular wavelength. By way of other examples, difference spectra properties P1 and P2 may be the result of an integration of averaging of the difference signal, equal an average of the SE alpha signal, equal a weighted average which accounts for instrument sensitivity, noise or signal sensitivity to overlay.

After difference spectra properties P1 and P2 are obtained, the overlay error E may then be calculated directly from the difference spectra properties P1 and P2 in operation 708. In one embodiment, a linear approximation is performed based on the difference spectra properties P1 and P2 to determine the overlay error E, while in another technique the difference spectra properties P1 and P2 are used to approximate a sine wave function or other periodic function which is then used to determine the overlay error E. One linear regression technique is illustrated below with respect to FIG. 7(b). In one example, the overlay result may be obtained by a statistical calculation (e.g. averaging or weighted averaging) of overlay results obtained from properties of multiple wavelengths or multiple wavelength ranges.

In a variation of this implementation, if all four targets have the same characteristics, such as pitch P, thin film characteristics, structure size and composition, except for the offsets, and assuming that Xa and Xb are opposite in sign and have the same order of magnitude and if Xa is the same sign as Xc and Xb is the same sign as Xd, an estimate of the overlay error E present between structures within the interlayer targets can be calculated as follows using a linear approximation based on the difference spectra properties P1 and P2:

$$E'=((S_C-S_D)*(Xa+Xb)/2-(S_A-S_B)*(XC+Xd)/2)/((S_A-S_B)-(S_C-S_D))$$

or $$E'=(P2*(Xa+Xb)/2+P1(Xc+Xd)/2)/(P1-P2)$$

where the difference spectra properties P1 and P2 are generally opposite in sign for overlay errors E<f0. If (Xa−Xb)=(Xc−Xd) and E=0, then P1=−1*P2.

Alternatively, if the same values for F and f0 are used for designing each target offset Xa, Xb, Xc, and Xd, then $$E'=(f0*P2+f0*P1)/(P1-P2).$$

The targets may be used to determine overlay of structures located at least partially in more than one layer, but could also be used to determine overlay of structures located substantially in a single layer. In other embodiments, the offsets may have the same sign.

Figure 7B:
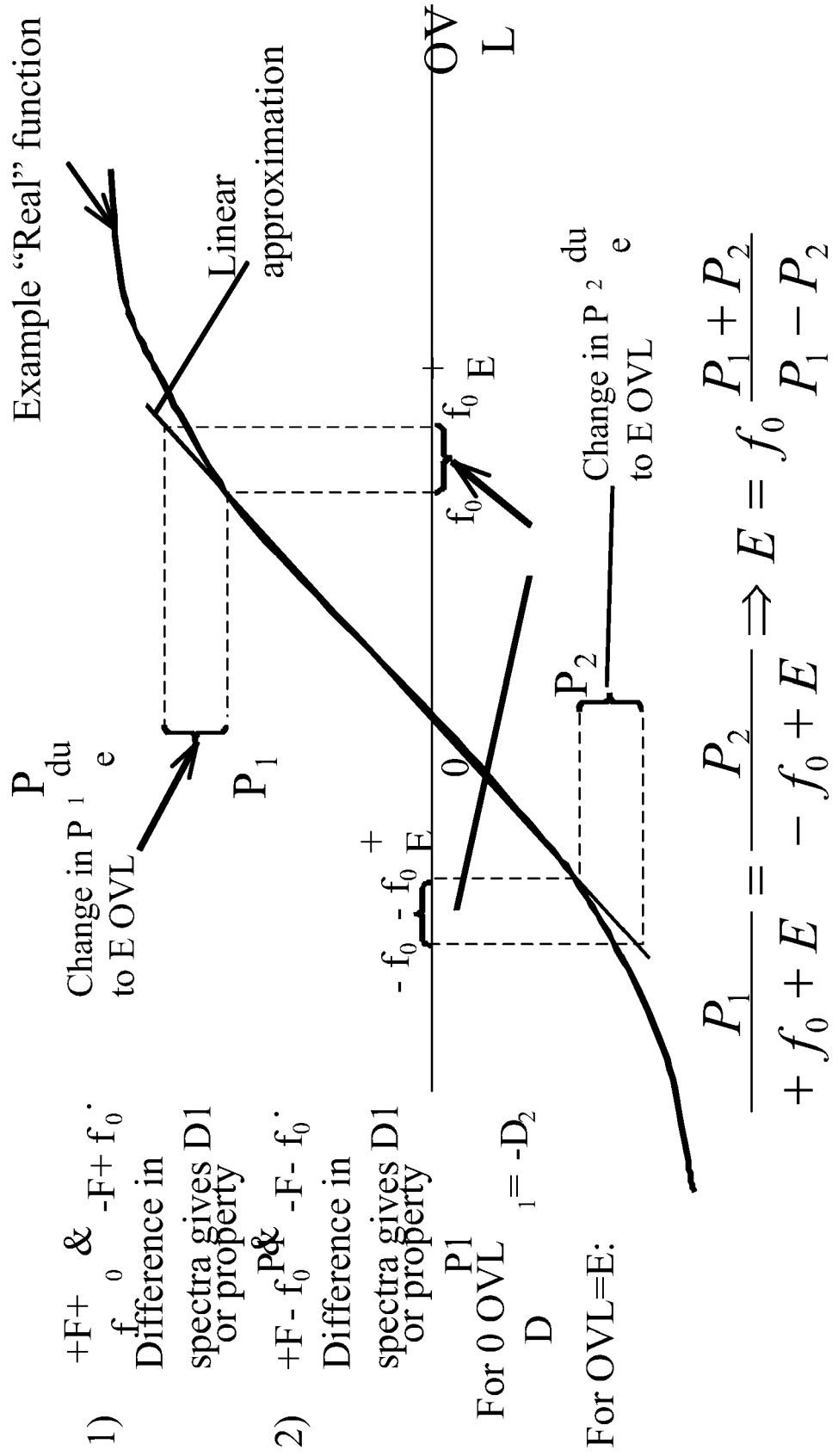
FIG. 7(b) shows a graphical representation of an approach to determination of overlay according to an embodiment of the present invention.

FIG. 7(b) shows a graphical representation of the linear approach for determining the overlay error E in accordance with one embodiment of the present invention. As shown, the positive portion of the y axis shows a change in the difference spectra property P1 as a function of f0+E and the negative portion of the y axis shows a change in the difference spectra as a function of −f0+E. As described above, the difference spectra properties P1 and P2 are obtained from the difference spectra D1 and D2.

The overlay error E may be obtained by analyzing the two points (+f0+E, P1) and (−f0+E, P2). The overlay error E may be determined in one approach by performing a linear approximation with the two obtained difference spectra properties P1 and P2. Note that there are two points on the graph where E is zero, while other portions of the graph are a function of the overlay error E and f0. If the offsets are chosen carefully so as to be in the linear region, then the slope of the positive portion of the graph (P1/(+f0+E)) should equal the slope of the negative portion of the graph (P2/(−f0+E). Thus, the overlay error is given by E=f0*(P1+P2)/(P1−P2).

According to an implementation of the invention, if there are two targets with offsets +F and −F that are equal in magnitude but opposite in sign and no other overlay errors, then the 0th diffraction order scatterometry SE or reflectometry spectra are substantially identical from these two targets (to a good approximation) and the difference signal between the spectra corresponding to +F and −F is zero. Of course, any property of the difference signal is also zero. If one deliberately breaks the symmetry (artificially induces an overlay error) by designing an additional offset +f0, then the difference signal D1 is no longer zero and any suitable difference spectra property follows the same relationship as for an overlay error E. Similarly one can design another set of overlay targets with an additional offset −f0. Thus, the overlay error may be determined using a property of the difference signals D1 (+F+f0, −F+f0) and D2 (+F−f0, −F−f0), and accordingly no separate calibration step is required.

It should be understood that when the overlay error E is calculated from the spectra signals, it may be an estimate of actual overlay error. The calculated overlay error E may be denoted as the overlay error (E), or an estimate of the overlay error (E').

If the pitch between structures is relatively large then the above described linear approximation techniques generally work well. However, when the pitch is relatively small then additional targets may be produced on the sample to improve the accuracy of the overlay measurements. The number of targets and corresponding scatterometry techniques which are used depend on the particular materials of the target and the scatterometry signal type implemented, among other factors. The number of targets can be determined experimentally or by well known modeling methods. In one embodiment, two additional interlayer targets (denoted targets "H" and "J") are produced on the sample, with corresponding offsets Xh and Xj. Upon being illuminated by incident radiation, the targets H and J produce corresponding diffracted components, which can serve as a basis for determination of an additional difference signal D3 and difference spectra property P3. This property P3 may be analyzed in connection with the difference spectra properties P1 and P2 to refine the determination of the overlay E to include non-linear corrections or measurements of the errors introduced by using a linear approximation.

In one target implementation, each of the targets A, B, C, and D comprises a grating structure Ga1 having periodic structures with a period Ta1 disposed at least partially within the first layer and a grating structure Ga2 having periodic structures with a period Ta2 disposed at least partially within the second layer (e.g., the target of FIG. 6c or 6d). Generally, a target could be any periodic structure like a particular device pattern repeated a number of times. One or more of the gratings Ga1 and/or Ga2 may be formed from device-like (e.g., design rule based) or process robust (e.g., low variability under variable process conditions). The first layer period Ta1 and the second layer period Ta2 could be identical or different as well (in the simplest case Ta1=n*Ta2 or Ta2=n*Ta1, where n is an integer), and the offsets Xa, Xb, Xc, and Xd are each produced by offsetting the structures with the period Ta1 of the grating structure Ga1 with respect to the structures with the period Ta2 of the grating structure Ga2 by the sum of a first distance F and a second distance f0, wherein the second distance f0 has a smaller absolute value than the first distance F.

In another target embodiment, the composite periodic structure comprising Ga1 and Ga2 is periodic with a period Ta, and it is possible to describe both Ga1 and Ga2 in terms of the period Ta, with Ga1 possibly having a complex structure (complex unit cell with multiple components) and Ga2 also possibly having a different complex structure (complex unit cell with multiple components). For example, a unit cell may include a set of closely spaced line segments adjacent to a large flat area. This unit cell is repeated to form either or both grating Ga1 or Ga2. Gratings Ga1 and Ga2 may have the same or different unit cells. Additionally, the unit cells of Ga1 may be a rational or integer number of the units cells of grating Ga2, or visa versa. Gratings Ga1 and/or Ga2 may also be designed to be similar to the critical device features—i.e. share one or more of the device characteristics such as pitch, line width, etc. Scatterometry overlay targets designed to be similar to the device features may provide advantages by processing more similarly to the device features, including reflecting the pattern-dependent overlay effects such as pattern-placement error.

One alternative embodiment to the linear approximation methods discussed above is to treat the scatterometry overlay signal as a periodic function and use phase detection methods to determine the overlay error (herein referred to as a phase scatterometry approach). This embodiment may be preferred in some circumstances, depending on variables that may include scatterometry overlay target pitch, scatterometry overlay target design, scatterometry overlay (SCOL) target materials, the measured scatterometry signal, and the like.

The overlay error may be extracted from measuring multiple SCOL targets with pre-programmed additional built-in overlay offsets. (One example of the preprogrammed offsets could be Xa, Xb, Xc, and Xd as discussed above and in FIG. 5). The number of targets measured may be two, three, four, or more than four, or may vary between different overlay measurement locations. For the phase methods, it may be advantageous for the offsets to be evenly distributed throughout the period, with differences corresponding to the period divided by the number of targets (e.g. Xa−Xc=Xc−Xb=Xb−Xd=Xd−Xa+P=P/4 for 4 targets for one direction). Alternatively, the offsets could be designed to distributed unevenly throughout the period which may be advantageous when used with some phase-detection algorithms.

A scatterometry signal (as a function of the wavelength or incident angle, for example) is acquired from each of the required SCOL targets. This signal is generally a periodic and even function of overlay error, for the case where the offsets are measured from a symmetry position of one of the L1 or L2 patterns. A phase detection (or phase retrieval, phase extraction, or phase determination) algorithm utilizes these properties of the signals.

The measured signal is represented by a set of even periodic functions with a corresponding number of free parameters (one of these free parameters is the overlay error itself). For example, each measured signal may be represented by a Fourier series expansion having any number of terms consistent with the number of targets measured. The number of terms depends on the number of targets measured, scatterometry signal properties, target properties, and information required. In a Fourier series having three terms, a measured signal may be represented by:

$$k + 1\cos\left(\frac{2\pi}{P}(V_i + E)\right) + m\cos\left(\frac{4\pi}{P}\right)(V_i + E)$$

where k; l is an amplitude of the first harmonic; m is the amplitude of the second harmonic; Vi represents the predefined offset; P is the period; and E is the overlay error. The number of targets measured is to be greater or equal to the cumulative number of free unknown parameters in the chosen function. In the above three term example, there are four unknowns: k, l, m, and E where the period is 360 degrees or 2Π radians. Therefore, four targets may be used to solve for the four unknowns which include overlay E.

When several (two or more) scatterometry overlay (SCOL) targets (with different pre-programmed offsets) are placed in the immediate vicinity of each other (within 0 to 250 microns, for example), the overlay error may be assumed to be the same for all these targets. Each of the other free parameters can either vary or not vary from one SCOL target location to the other one (within the field and/or across the wafer). (Overlay is assumed to vary between different overlay measurement locations in the stepper field or across the wafer). Alternatively, these free parameters (or some of them) may either vary or not vary between X- and Y-SCOL target orientations. Based on the information required, the measurement accuracy required and on whether some free parameters are not varying location-to-location and/or between X- and Y-orientations, the total number of SCOL targets per overlay measurement location and total number of SCOL targets to be measured per field and/or per wafer is determined.

An example of a phase algorithm approach to determining overlay error from scatterometry signals from multiple targets is to treat the dependence of the scatterometry signals on overlay error as a periodic function. In this case the programmed offsets of the multiple targets are treated as initial phase offsets and the overlay error is treated as an additional phase. The overlay error can then be determined using well-known phase determination or phase retrieval methods. Well known phase retrieval methods that may include quadrature, 3-bucket, and 4-bucket phase retrieval algorithms can be used to determine overlay error. These phase retrieval methods are listed as examples only and are not meant to limit the scope of the invention. Phase detection methods are well known and are commonly used in diverse areas such as communications, interferometry, nuclear magnetic resonance, electronic circuits, to list a few examples. In another embodiment, a combination of linear, non-linear, and phase retrieval algorithms may be employed to determine the overlay error.

Certain conditions are preferably met with implementation of the above described techniques. The measurement areas are substantially identical in all aspects except for the offsets, e.g., +F+f0, −F+f0, +F−f0, and −F−f0. This is likely accomplished by placing the targets within about 100 microns or less of each other and by choosing targets which are relatively-robust to the process (i.e. they have similar or less sensitivity to process variation as the device features). In practice, on production wafers, the profiles may deviate from identical for different offsets if the topography from the lower pattern layer(s) and the upper layer changes in response to interacting with this topography. A difference or error signal between the two targets with different offsets is relatively independent of profile variation of the overlay target segments and to film variation as long as the profiles are common to the different targets. This is the substantial equivalent of common mode rejection of the parts of the signal that are determined by the profile and the films and the optics. The technique is also preferably robust to the range of process variation encountered in a typical manufacturing process. The signal differences due to the overlay error are also preferably larger than the signal differences due to other sources of process variation between the nearby scatterometry overlay targets (including mask errors).

If in a particular implementation the targets include structures grouped to exhibit the characteristics of lines, then a separate set of targets may be required for X and Y overlay measurements. If the overlay targets are composed of 2-dimensional structures (as seen from a top down view), then it may be possible to use one set of targets to get both X and Y overlay information. For oblique scatterometry, according to a specific implementation, it may be advantageous to rotate the orientation of the wafer with respect to the optical scattering plane to measure the different X and Y overlay errors. For true normal incidence, it may be possible to get both X and Y overlay information from the different polarizations without rotating the wafer or the optics.

Cartesian coordinates provide a convenient frame of reference for measuring overlay within a sample, with the x-y plane being located within, or substantially parallel with, a layer of the sample, and with the z axis being substantially perpendicular to the layers of the sample. The Cartesian coordinate system could be fixed with respect to the sample or could be rotated to reduce the complexity of the measurements. For example, overlay occurring diagonally across the sample but within a single layer could be described as two-dimensional x-y overlay in a Cartesian system with the x-y axes substantially parallel with the sides of a rectangular sample or stepper field. That same diagonal overlay could be measured along a single axis, however, by rotating the x-y axes such that the x axis is parallel with the direction of the diagonal overlay.

In one embodiment, targets include more than one predefined offset, possibly between different sets of structures located in two layers, or possibly between different sets of structures located in more than two layers. In a general case, a target may include an indefinite number of layers, with all or some of these layers having structures producing predefined offsets. In a particular implementation, the structures in one or more underlying patterned layers of a target cause changes in the shape or topography of one or more upper layers (disposed above the underlying patterned layer(s)). In this implementation, the one or more upper layers may be substantially or partially opaque or absorbing, and at least part of the diffraction signal may arise from the topography of an upper layer, the topography arising at least in part from the underlying patterned layer.

According to one embodiment, structures included in a target may be organized in various configurations and shapes, including, for example, lines, grids, rectangles, squares, curved lines, curved shapes, circles, cylindrical shapes, conical shapes or combinations of the foregoing. Such configurations of structures may be disposed at various locations within the target, and may describe various angles with respect to the electromagnetic radiation incident on the target. For example, the sets of structures could be organized as a set of parallel lines perpendicular to the direction of propagation of a collimated set of radiation rays or of a beam incident on the target. In another case, the structures organized as a set of parallel lines could be disposed at an acute angle with respect to the incident radiation, possibly at an angle of 45 degrees. Such a configuration could be advantageous by facilitating determination of overlay in both x and y directions, thereby reducing the need for additional overlay patterns or measurements.

Alternatively, the incident radiation could be directed to be substantially parallel to at least some of the parallel lines comprising the structures or defining the structures. This technique allows one to perform x and y overlay measurements without rotating the sample.

Although the foregoing invention has been described in some detail for purposes of clarity of understanding, it will be apparent that certain changes and modifications may be practiced within the scope of the appended claims. For example, although the terms wafer or sample were used throughout (e.g., semiconductor), it should be noted that any type of workpieces may be utilized, such as substrates, photomasks, flat panel displays, electro-optic devices, and the like which are associated with other types of manufacturing. The term "stepper" was used throughout as an example to generically represent lithography systems in use or in development in the semiconductor industry and related industries and is not a limitation on the lithography systems which may include steppers, scanner, imprint lithographic systems, electron based lithographic patterning systems, EUV based lithographic patterning systems and the like. Therefore, the described embodiments should be taken as illustrative and not restrictive, and the invention should not be limited to the details given herein but should be defined by the following claims and their full scope of equivalents.

What is claimed is:

1. A method of determining a characteristic of a plurality of periodic structures using a scatterometry metrology tool having two or more measurement modules for generating two or more optical beams, the method comprising:

providing a first periodic target that is formed from a plurality of features and is selected from a group consisting of a periodic critical dimension (CD) target and a periodic overlay target;

providing a second periodic target that is formed from a plurality of features and is selected from a group consisting of a periodic critical dimension (CD) target and a periodic overlay target, wherein the first and second periodic targets are disposed on a same substrate and a center of the first periodic target has a distance from a center of the second periodic target and such distance substantially matches a bore distance between a first and a second measurement module of the scatterometry metrology tool; and obtaining a first spectra from the first periodic target using the first measurement module while substantially simultaneously obtaining a second spectra from the second periodic target; and analyzing the first spectra to determine a first characteristic of the first periodic target and analyzing the second spectra to determine a second characteristic of the second periodic target, wherein the first and second characteristics are each selected from a group consisting of an overlay value, a CD value, and a profile value.

2. A method as recited in claim 1, wherein the first periodic target is a periodic CD target and the second periodic target is a periodic overlay target, and wherein the first characteristic is an CD or profile value and the second characteristic is an overlay value.

3. A method as recited in claim 1, wherein the first and second periodic targets are each a periodic CD target and the first and second characteristics are CD/profile characteristics.

4. A method as recited in claim 1, wherein the first and second periodic targets are each a periodic overlay target and the first and second characteristics are overlay values.

5. A method as recited in claim 2, wherein the second spectra includes spectra from the first overlay target and a second overlay target, the method further comprising obtaining spectra from a third and fourth overlay target, wherein the overlay value is determined based on the spectra from the first, second, third, and fourth overlay targets.

6. A method as recited in claim 5, wherein the spectra from the first and second overlay targets are obtained when the first spectra is obtained from the CD target.

7. A method as recited in claim 2, wherein the second spectra is analyzed in conjunction with spectra obtained from at least two other overlay targets on a same layer as the first overlay target and spectra obtained from at least three other overlay targets on a second layer to determine an overlay value.

8. A method as recited in claim 1, wherein the overlay value is determined without using a reference spectra obtained from overlay targets measured on a reference sample or simulation of overlay measurements.

9. A method as recited in claim 5, wherein a spectra is obtained from the third and fourth overlay targets while a third spectra is obtained from a second CD target.

10. A method as recited in claim 1, wherein the first measurement module is a spectroscopic ellipsometer and the second measurement module is a spectroscopic reflectometer.

11. A method as recited in claim 1, wherein the first and second measurement modules are each spectroscopic ellipsometers.

12. A method as recited in claim 1, wherein the first and second measurement modules are each and the second measurement module are each spectroscopic reflectometers.

13. A method as recited in claim 1, wherein one of the measurement modules is a multi-spot system may be used to achieve two spots that illuminate the same grating in an Azimuth angle of 90 degrees.

14. A method as recited in claim 1, wherein the measurement modules are selected from one or more of the following systems: a scanning reflectometer system, a system with two or more reflectometers capable of parallel data acquisition, a system with two or more spectroscopic reflectometers capable of parallel data acquisition, a system with two or more polarized spectroscopic reflectometers capable of parallel data acquisition, a system with two or more polarized spectroscopic reflectometers capable of serial data acquisition without moving the wafer stage or moving any optical elements or the reflectometer stage, a scanning ellipsometer system, a system with two or more ellipsometers capable of parallel data acquisition, a system with two or more ellipsometers capable of serial data acquisition without moving the wafer stage or moving any optical elements or the ellipsometer stage, a Michelson interferometer, and a Mach-Zehnder interferometer, a Sagnac interferometer, a scanning angle of incidence system, and a scanning azimuth angle system.

15. A method of forming a semiconductor target for measurement with a scatterometry metrology tool having two or more measurement modules for generating two or more optical beams, the method comprising:

forming a first periodic target that has a plurality of features and is selected from a group consisting of a periodic critical dimension (CD) target and a periodic overlay target;

forming a second periodic target that has a plurality of features and is selected from a group consisting of a periodic critical dimension (CD) target and a periodic overlay target, whereby the first and second periodic targets are disposed on a same substrate and formed such that a center of the first periodic target has a distance from a center of the second periodic target and such distance substantially matches a bore distance between a first and a second measurement module of the scatterometry metrology tool.

16. A method as recited in claim 15, further comprising:

obtaining a first spectra from the first periodic target using the first measurement module while substantially simultaneously obtaining a second spectra from the second periodic target; and analyzing the first spectra to determine a first characteristic of the first periodic target and analyzing the second spectra to determine a second characteristic of the second periodic target, wherein the first and second characteristics are each selected from a group consisting of an overlay value, a CD value, and a profile value.

17. A semiconductor target for measurement with a scatterometry metrology tool having two or more measurement modules for generating two or more optical beams, comprising:

a first periodic target that has a plurality of features and is selected from a group consisting of a periodic critical dimension (CD) target and a periodic overlay target;

a second periodic target that has a plurality of features and is selected from a group consisting of a periodic critical dimension (CD) target and a periodic overlay target, whereby the first and second periodic targets are disposed on a same substrate and have a center of the first periodic target has a distance from a center of the second periodic target and such distance substantially matches a bore distance between a first and a second measurement module of the scatterometry metrology tool.

18. A target as recited in claim 17, wherein the first periodic target is a periodic CD target and the second periodic target is a periodic overlay target.

19. A target as recited in claim 17, wherein the first and second periodic targets are each a periodic CD target and the first and second characteristics are CD/profile characteristics.

20. A target as recited in claim 17, wherein the first and second periodic targets are each a periodic overlay target and the first and second characteristics are overlay values.

\* \* \* \* \*